United States Patent
Ausserlechner et al.

(10) Patent No.: US 9,678,172 B2
(45) Date of Patent: *Jun. 13, 2017

(54) CURRENT DIFFERENCE SENSORS, SYSTEMS AND METHODS

(71) Applicant: Infineon Technologies AG, Neubiberg (DE)

(72) Inventors: Udo Ausserlechner, Villach (AT); Berthold Astegher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/636,573

(22) Filed: Mar. 3, 2015

(65) Prior Publication Data
US 2015/0177339 A1    Jun. 25, 2015

Related U.S. Application Data

(63) Continuation of application No. 13/012,096, filed on Jan. 24, 2011, now Pat. No. 8,975,889.

(51) Int. Cl.
*G01R 33/06* (2006.01)
*G01R 15/20* (2006.01)
*G01R 33/09* (2006.01)

(52) U.S. Cl.
CPC ........... *G01R 33/06* (2013.01); *G01R 15/202* (2013.01); *G01R 15/205* (2013.01); *G01R 33/093* (2013.01); *G01R 33/096* (2013.01)

(58) Field of Classification Search
CPC .... G01R 15/202; G01R 15/205; G01R 33/06; G01R 33/093; G01R 33/096
(Continued)

(56) References Cited

U.S. PATENT DOCUMENTS

| | | |
|---|---|---|
| 3,323,057 A | 5/1967 | Haley |
| 4,021,729 A | 5/1977 | Hudson, Jr. |

(Continued)

FOREIGN PATENT DOCUMENTS

| | | |
|---|---|---|
| CN | 1095162 A | 11/1994 |
| CN | 1132858 A | 10/1996 |

(Continued)

OTHER PUBLICATIONS

Steiner, et al. "Fully Packaged CMOS Current Monitor Using Lead-On-Chip Technology." Physical Electronics Laboratory, pp. 603-608. © 1998.

(Continued)

*Primary Examiner* — Jay Patidar
(74) *Attorney, Agent, or Firm* — Eschweiler & Potashnik, LLC

(57) ABSTRACT

Embodiments relate to current difference sensors, systems and methods. In an embodiment, a current difference sensor includes first and second conductors arranged relative to one another such that when a first current flows through the first conductor and a second current, equal to the first current, flows through the second conductor, a first magnetic field induced in the first conductor and a second magnetic field induced in the second conductor cancel each other at a first position and a second position; and first and second magnetic field sensing elements arranged at the first and second positions, respectively.

12 Claims, 9 Drawing Sheets

(58) Field of Classification Search
USPC .................................................. 324/116–127
See application file for complete search history.

(56) References Cited

U.S. PATENT DOCUMENTS

| | | | |
|---|---|---|---|
| 4,559,495 A | 12/1985 | Lienhard | |
| 4,894,610 A | 1/1990 | Friedl | |
| 5,017,804 A | 5/1991 | Harnden et al. | |
| 5,041,780 A | 8/1991 | Rippel | |
| 5,173,758 A | 12/1992 | Heremans | |
| 5,451,865 A * | 9/1995 | Coburn | G01R 1/203 324/105 |
| 5,642,041 A | 6/1997 | Berkcan | |
| 5,786,976 A | 7/1998 | Field | |
| 5,963,028 A | 10/1999 | Engel et al. | |
| 6,040,690 A | 3/2000 | Ladds | |
| 6,310,470 B1 | 10/2001 | Hebing et al. | |
| 6,341,416 B1 | 1/2002 | Biskeborn et al. | |
| 6,356,068 B1 | 3/2002 | Steiner et al. | |
| 6,424,018 B1 | 7/2002 | Ohtsuka | |
| 6,452,413 B1 | 9/2002 | Burghartz | |
| 6,462,531 B1 | 10/2002 | Ohtsuka | |
| 6,512,359 B1 | 1/2003 | Tamai et al. | |
| 6,636,029 B1 | 10/2003 | Kunze et al. | |
| 6,683,448 B1 | 1/2004 | Ohtsuka | |
| 6,727,683 B2 | 4/2004 | Goto et al. | |
| 6,781,313 B2 | 8/2004 | Aiken | |
| 6,781,358 B2 | 8/2004 | Goto et al. | |
| 6,841,989 B2 | 1/2005 | Goto et al. | |
| 6,940,265 B2 | 9/2005 | Hauenstein et al. | |
| 6,949,927 B2 | 9/2005 | Goetz | |
| 6,995,315 B2 | 2/2006 | Sharma et al. | |
| 7,075,287 B1 | 7/2006 | Mangtani et al. | |
| 7,129,691 B2 | 10/2006 | Shibahara et al. | |
| 7,166,807 B2 | 1/2007 | Gagnon et al. | |
| 7,259,545 B2 | 8/2007 | Stauth et al. | |
| 7,358,724 B2 | 4/2008 | Taylor et al. | |
| 7,375,507 B2 | 5/2008 | Racz et al. | |
| 7,474,093 B2 | 1/2009 | Ausserlechner | |
| 7,476,816 B2 | 1/2009 | Doogue et al. | |
| 7,476,953 B2 | 1/2009 | Taylor et al. | |
| 7,525,300 B2 | 4/2009 | Watanabe et al. | |
| 7,528,593 B2 | 5/2009 | Tanizawa | |
| 7,545,136 B2 | 6/2009 | Racz et al. | |
| 7,564,239 B2 | 7/2009 | Mapps et al. | |
| 7,605,580 B2 | 10/2009 | Strzalkowski | |
| 7,709,754 B2 | 5/2010 | Doogue et al. | |
| 7,746,056 B2 | 6/2010 | Stauth et al. | |
| 7,816,905 B2 | 10/2010 | Doogue et al. | |
| 7,923,987 B2 | 4/2011 | Ausserlechner | |
| 8,159,254 B2 | 4/2012 | Kaltalioglu | |
| 8,217,643 B2 | 7/2012 | Kuroki et al. | |
| 8,283,742 B2 | 10/2012 | Motz et al. | |
| 8,421,442 B2 | 4/2013 | Younsi et al. | |
| 8,878,520 B2 * | 11/2014 | Tamura | G01R 15/20 324/117 R |
| 2001/0052780 A1 | 12/2001 | Hayat-Dawoodi | |
| 2003/0155905 A1 | 8/2003 | Hauenstein | |
| 2004/0155644 A1 | 8/2004 | Stauth et al. | |
| 2005/0030004 A1 | 2/2005 | Takatsuka et al. | |
| 2005/0270013 A1 | 12/2005 | Berkcan et al. | |
| 2005/0270014 A1 | 12/2005 | Zribi et al. | |
| 2006/0076947 A1 | 4/2006 | Berkcan et al. | |
| 2006/0082983 A1 | 4/2006 | Parkhill | |
| 2006/0255797 A1 | 11/2006 | Taylor et al. | |
| 2006/0284613 A1 | 12/2006 | Hastings et al. | |
| 2007/0063690 A1 | 3/2007 | De Wilde et al. | |
| 2007/0170533 A1 | 7/2007 | Doogue | |
| 2007/0290682 A1 | 12/2007 | Oohira | |
| 2008/0035923 A1 | 2/2008 | Tschmelitsch et al. | |
| 2008/0143329 A1 | 6/2008 | Ishihara | |
| 2008/0297138 A1 | 12/2008 | Taylor et al. | |
| 2008/0312854 A1 | 12/2008 | Chemin et al. | |
| 2009/0021249 A1 | 1/2009 | Kumar et al. | |
| 2009/0026560 A1 | 1/2009 | Wombacher et al. | |
| 2009/0050990 A1 | 2/2009 | Aono et al. | |
| 2009/0058412 A1 | 3/2009 | Taylor et al. | |
| 2009/0128130 A1 | 5/2009 | Stauth et al. | |
| 2009/0152595 A1 | 6/2009 | Kaga et al. | |
| 2009/0184704 A1 | 7/2009 | Guo et al. | |
| 2009/0294882 A1 | 12/2009 | Sterling | |
| 2009/0295368 A1 | 12/2009 | Doogue et al. | |
| 2009/0322325 A1 | 12/2009 | Ausserlechner | |
| 2010/0045285 A1 | 2/2010 | Ohmori et al. | |
| 2010/0045286 A1 | 2/2010 | Hotz et al. | |
| 2010/0117638 A1 | 5/2010 | Yamashita et al. | |
| 2010/0156394 A1 | 6/2010 | Ausserlechner et al. | |
| 2010/0182002 A1 * | 7/2010 | Van Zon | B82Y 25/00 324/244 |
| 2010/0231198 A1 | 9/2010 | Bose et al. | |
| 2010/0237853 A1 | 9/2010 | Bose et al. | |
| 2010/0315095 A1 | 12/2010 | Younsi et al. | |
| 2011/0062956 A1 | 3/2011 | Edelstein | |
| 2011/0133732 A1 | 6/2011 | Sauber | |
| 2011/0172938 A1 | 7/2011 | Gu et al. | |
| 2011/0204887 A1 | 8/2011 | Ausserlechner et al. | |
| 2011/0221429 A1 | 9/2011 | Tamura | |
| 2011/0227560 A1 | 9/2011 | Haratani et al. | |
| 2011/0234215 A1 | 9/2011 | Ausserlechner | |
| 2011/0248711 A1 | 10/2011 | Ausserlechner | |
| 2011/0298454 A1 | 12/2011 | Ausserlechner | |
| 2011/0304327 A1 | 12/2011 | Ausserlechner | |
| 2012/0049884 A1 | 3/2012 | Kaltalioglu | |
| 2012/0086433 A1 | 4/2012 | Cheng et al. | |
| 2012/0112365 A1 | 5/2012 | Ausserlechner et al. | |
| 2012/0146164 A1 | 6/2012 | Ausserlechner | |
| 2012/0146165 A1 | 6/2012 | Ausserlechner et al. | |
| 2012/0262152 A1 | 10/2012 | Ausserlechner | |
| 2013/0106412 A1 | 5/2013 | Nomura et al. | |
| 2013/0265041 A1 * | 10/2013 | Friedrich | G01R 15/207 324/260 |

FOREIGN PATENT DOCUMENTS

| | | |
|---|---|---|
| CN | 1261959 A | 8/2000 |
| CN | 1885044 A | 12/2006 |
| CN | 101495874 A | 7/2009 |
| CN | 201514439 U | 6/2010 |
| DE | 19821492 | 11/1999 |
| DE | 29819486 U1 | 3/2000 |
| DE | 19946935 | 5/2001 |
| DE | 10051160 A1 | 5/2002 |
| DE | 10233129 A1 | 2/2003 |
| DE | 10231194 | 2/2004 |
| DE | 602005003777 T2 | 12/2008 |
| DE | 202010011725 U | 1/2011 |
| JP | 2002243766 A | 8/2002 |
| JP | 2006208278 A | 8/2006 |
| WO | 0123899 A1 | 4/2001 |
| WO | 2005033718 A1 | 4/2005 |
| WO | 2009119238 A1 | 8/2006 |
| WO | 2008008140 | 1/2008 |
| WO | 2009088767 A1 | 7/2009 |
| WO | 2010048037 A2 | 4/2010 |

OTHER PUBLICATIONS

Lutz, et al. "Double-Sided Low-Temperature Joining Technique for Power Cycling Capability at High Temperature," EPE 2005—Dresden, ISBN 90-75815-08-5.

Schwarzbauer, et al. "Novel Large Area Joining Technique for Improved Power Device Performance." IEEE Transactions on Industry Applications, vol. 27, No. 1, pp. 93-95, 1991.

Allegro, Allegro Hall Effect-Based Current Sensor ICs: Revolutionary, high accuracy, high bandwidth current sensing!, www.allegromicro.com/en/Products/Design/curren_sensors/index.asp, 5 Pages. © 2010.

Allegro, Hall-Effect Sensor IC's: Current Sensor ICs, 1 Page, © 2010.

Allegro, High Bandwidth, Fast Fault Response Current Sensor IC in Thermally Enhanced Package. ACS709-DS, www.microallegro.com, 16 pages, © 2008-2009.

(56) References Cited

OTHER PUBLICATIONS

Allegro, Fully Integrated Hall Effect-Based Linear Current Sensor IC with 2.1 KvRMS Isolation and a Low-Resistance Current Conductor, ACS712-DS, Rev. 13, 14 pages, © 2006-2010.
Sandireddy, Sandhya, IEEE Xplore, © 2005, Advanced Wafer Thinning Technologies to Enable Multichip Packages, pp. 24-27.
Hopkins, Allegro MicroSystems, Inc., High Performance Power Ics and Hall Effect Sensor, "Hall Effect Technology for Server, Backplane and Power Supply Applications." IBM 2008 Power and Cooling Symposium, Sep. 30, 2008, 34 pages.
Chinese Application No. 201210018577.6, Filed Jan. 20, 2012, Chinese First Office Action, issued Jan. 3, 2014.
Yang, Lixin, Differential Current Transducer for Localization Type A Metro Vehicle, Journal of Railway, Engineering Society, Issue 10, Oct. 31, 2007, pp. 89-92.
Application and File History for U.S. Appl. No. 12/813,218, filed Jun. 10, 2010. Inventors: Ausserlechner, et al.
Application and File History for U.S. Appl. No. 13/086,566, filed Apr. 14, 2011. Inventors: Ausserlechner, et al.
Non-Final Office Action dated Sep. 16, 2013 for U.S. Appl. No. 13/012,096.
Non-Final Office Action dated Jan. 28, 2014 for U.S. Appl. No. 13/012,096.
Final Office Action dated Aug. 5, 2014 for U.S. Appl. No. 13/012,096.
Notice of Allowance dated Oct. 31, 2014 for U.S. Appl. No. 13/012,096.
Application and File History for U.S. Appl. No. 12/630,596, filed Dec. 3, 2009. Inventors: Ausserlechner, et al.
Application and File History for U.S. Appl. No. 12/711,471, filed Feb. 24, 2010. Inventors: Ausserlechner, et al.

\* cited by examiner

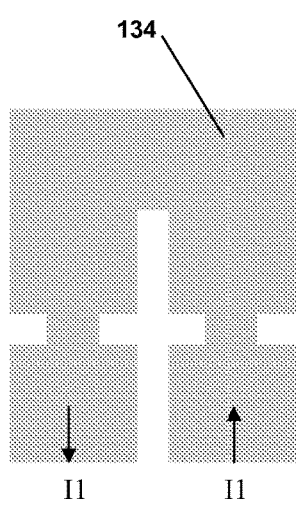
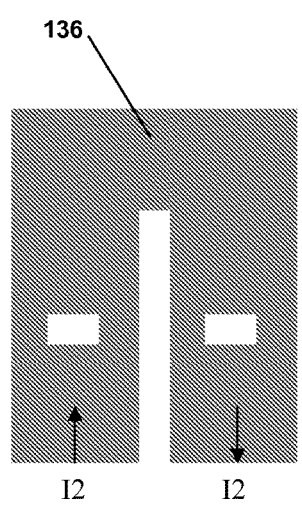
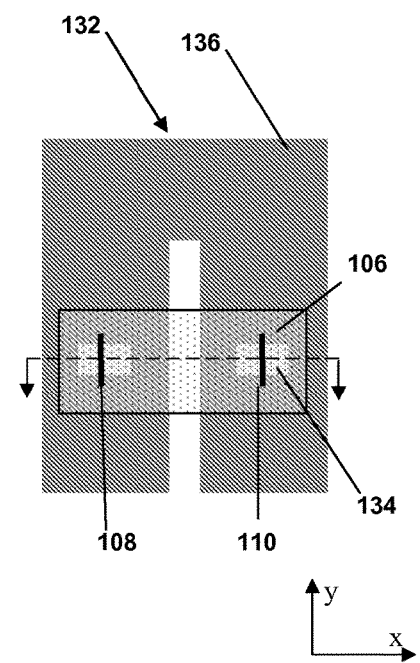
FIG. 14A    FIG. 14B    FIG. 14C
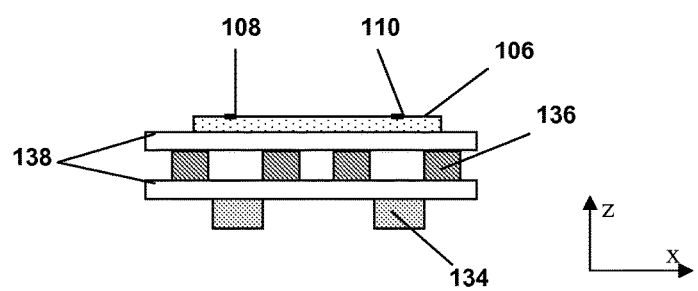
FIG. 14D

CURRENT DIFFERENCE SENSORS, SYSTEMS AND METHODS

REFERENCE TO RELATED APPLICATION

This application is a continuation of U.S. application Ser. No. 13/012,096 filed on Jan. 24, 2011.

TECHNICAL FIELD

The invention relates generally to current sensors and more particularly to current difference sensors suitable, for example, for sensing small current differences.

BACKGROUND

Conventional current difference sensing systems often use a ring-shaped ferrite. Two wires are coupled to the ring such that two currents flow through the ring in opposite directions and their flux contributions cancel. If the two currents are different, a net flux is carried by the ferrite, which can be detected by a secondary winding and processed electronically.

While such systems can be effective for detecting current differences, they provide only limited information. For example, they can detect whether |I1−I2|>threshold but do not provide any reliable information regarding I1+I2 or I1−I2.

Therefore, there is a need for improved current difference sensing systems and methods.

SUMMARY

Current difference sensors, systems and methods are disclosed. In an embodiment, a current difference sensor comprises first and second conductors arranged relative to one another such that when a first current flows through the first conductor and a second current, equal to the first current, flows through the second conductor, a first magnetic field caused by the first current and a second magnetic field caused by the second current cancel each other at a first position and a second position; and first and second magnetic field sensing elements arranged to detect the first and second magnetic fields.

In an embodiment, a method comprises inducing a first current to flow in a first conductor; inducing a second current to flow in a second conductor; arranging the first and second conductors such that at least one component of a total magnetic field caused by the first and second currents is approximately zero in at least two locations when the first and second currents are approximately equal; positioning magnetic field sensors in the at least two locations; and determining a difference between the first and second currents based on sensed magnetic fields.

In an embodiment, a method comprises arranging a first conductor spaced apart from and substantially parallel to a second conductor; arranging a die proximate the first and second conductors; and arranging a plurality of magnetic field sensing elements on a first surface of the die to detect magnetic fields caused by first and second currents in the first and second conductors, respectively, and determine a difference between the first and second currents based on the magnetic fields.

BRIEF DESCRIPTION OF THE DRAWINGS

The invention may be more completely understood in consideration of the following detailed description of various embodiments of the invention in connection with the accompanying drawings, in which:

FIG. 14A depicts a top plan view of a current difference sensor conductor according to an embodiment.

FIG. 14B depicts a top plan view of a current difference sensor conductor according to an embodiment.

FIG. 14C depicts a top plan view of the current difference sensor conductors of FIGS. 14A and 14B.

FIG. 14D is a side cross-sectional view of the current difference sensor of FIGS. 14A-14C.

Figure 1:
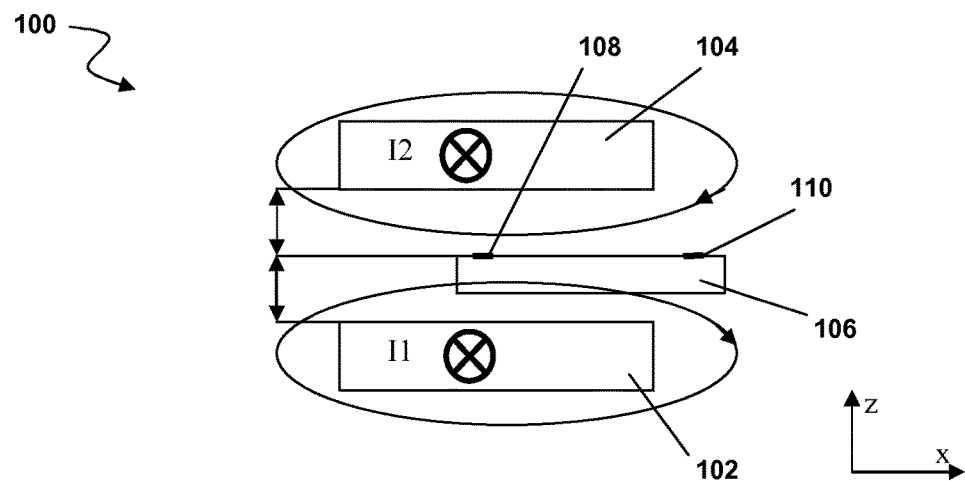
FIG. 1 depicts a side cross-sectional view of a current difference sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to current difference sensors. In various embodiments, a current difference sensor can compare two currents and detect a difference therebetween. In one embodiment, the detectable difference can be as small as about 10 mA for currents in a range of about zero to about 30 A, though this can vary in other embodiments. Additionally, embodiments can provide reduced delay times, such as below about 1 microsecond, and provide information regarding I1+I2 as well as I1−I2. Further, embodiments are small in size, robust against interference and inexpensive.

Embodiments comprise two conductors arranged such that when equal currents pass therethrough, magnetic field contributions of each conductor cancel at points at which magnetic field sensor elements, sensing the same magnetic field components, can be arranged. Unequal, or difference, currents can then be detected, with the components subtracted in order to cancel homogeneous background fields.

Referring to FIG. 1, an embodiment of a current difference sensor 100 is depicted. Sensor 100 comprises two conductors 102 and 104 spaced apart from one another on two different planes or levels. A die 106 is arranged therebetween on a third plane or level, and two magnetoresistors (MRs) 108 and 110 are disposed on die 106. MRs 108 and 110 are spaced apart from one another and disposed on a plane approximately midway between conductors 102 and 104 and therefore between currents I1 and I2 in conductors 102 and 104, respectively. In embodiments, MRs 108 and 110 can comprise anisotropic MRs, giant MRs or some other MR effect technology.

Because of assembly tolerances and other factors, however, it is virtually impossible in practice to position MRs 108 and 110 exactly midway between conductors 102 and 104. The resulting magnetic fields, Bx1 on MR 108 and Bx2 on MR 110, therefore are as follows:

$$Bx1=(K+dK)*I1-(K-dK)*I2$$

$$Bx2=(K'+dK')*I1-(K'-dK')*I2$$

$$Bx1-Bx2=(K-K')*(I1-I2)+(dK-dK')*(I1+I2)$$

The difference measurement, Bx1−Bx2, is thus corrupted by the sum of the currents, I1+I2. One solution to this issue would be to provide several MRs on the top surface of die 106 and then select the MRs which have the best suppression of (I1+I2). Because this is generally not a good solution, another solution is to add Hall plates to sensor 100, with a first, H1, arranged proximate MR 108 and a second, H2, arranged proximate MR 110. Then:

$$H2-H1=Kz*(I1+I2)$$

which leads to:

$$I1-I2=[(Bx1-Bx2)/(K-K')]-[(dK-dK'(H2-H1)/(Kz*(K-K'))]$$

An advantage of this configuration is that it has a low resistance because conductors 102 and 104, in an embodiment, are simple straight bars. Additionally, information regarding I1+I2 and I1−I2 can be obtained.

Figure 2:
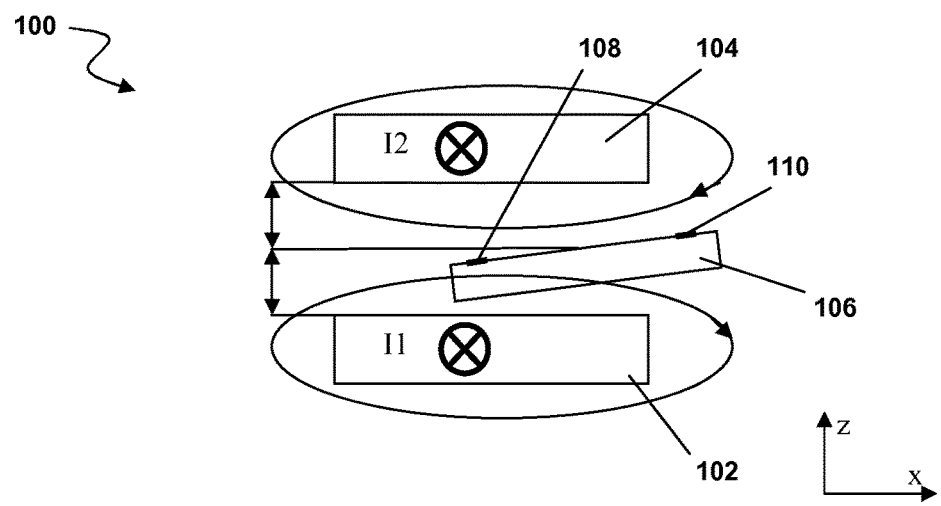
FIG. 2 depicts a side cross-sectional view of a current difference sensor according to an embodiment.

Another embodiment is depicted in FIG. 2, in which die 106 is mounted in a slightly tilted orientation with respect to the planes of conductors I1 and I2. The tilt angle of die 106 can vary but is generally configured to be larger than worst-case assembly tolerances. Additionally, a plurality of MRs 108 and 110 are arranged on the top surface of die 106. While only MRs 108 and 110 are visible in FIG. 2, this embodiment of sensor 100 comprises additional MRs arranged in a grid on the top surface of die 106, spaced apart by, for example, 25 micrometers along the x-axis. The spacing can vary in other embodiments. After assembly of sensor 100, the signals of all MRs 108 and 110 as well as the grid are tested, and those having the lowest sensitivity to I1+I2 are selected.

Figure 3:
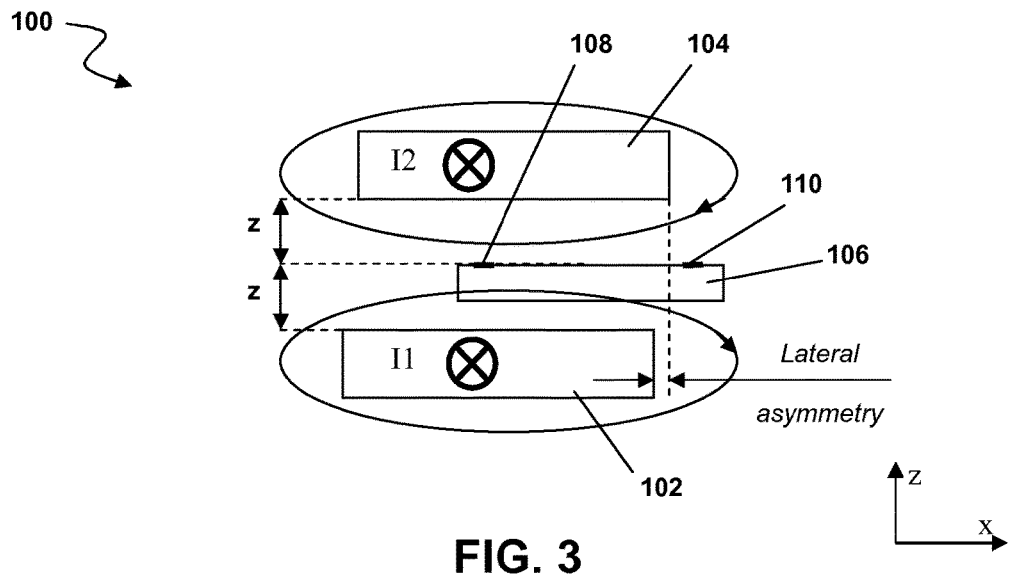
FIG. 3 depicts a side cross-sectional view of a current difference sensor according to an embodiment.

Another embodiment is depicted in FIG. 3, in which a small, generally arbitrary lateral asymmetry is introduced between conductors 102 and 104. As in the embodiment of FIG. 2, a grid of MRs 108 and 110 and others not visible in FIG. 3 is arranged on the top surface of die 106, and those having the lowest sensitivity to I1+I2 are selected. In an embodiment, conductors 102 and 104 are each about 6 mm by about 1 mm and are shifted relative to each other by less than about 1 mm in the x-direction in embodiments, such as by about 0.2 mm in one embodiment.

Figure 4:
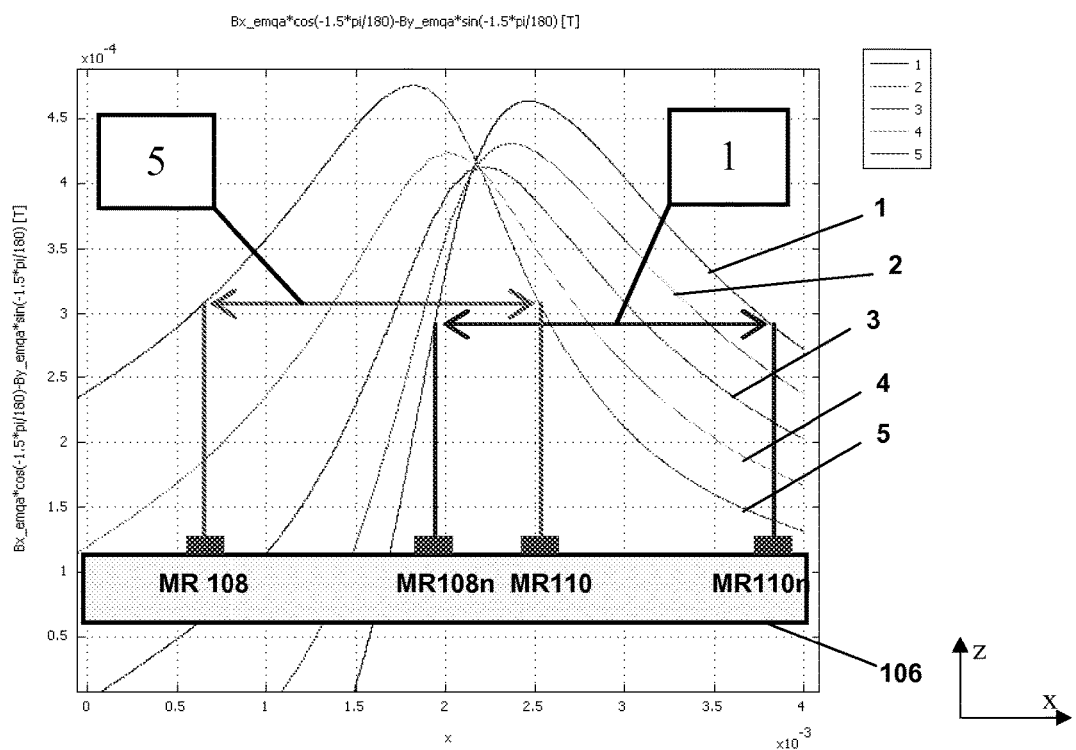
FIG. 4 depicts a graph of magnetic fields for various die and conductor arrangements according to an embodiment.

Because of assembly tolerances, it is assumed, for purposes of this example embodiment, that die 106 is tilted by about 1.5 degrees around the symmetry center of conductors 102 and 104. Referring also to FIG. 4, the magnetic field Bx for five different scenarios is depicted, for all of which I1=I2=30 A and z=0.5 mm. For scenario 1, die 206 is shifted 100 .mu.m (from center) toward conductor 104. For scenario 2, die 206 is shifted 50 .mu.m (from center) toward conductor 104. For scenario 3, die 206 is at center. For scenario 4, die 206 is shifted 50 .mu.m toward conductor 102. For scenario 5, die 206 is shifted 100 .mu.m toward conductor 102.

In back-end test, after die 106 is mounted between conductors 102 and 104, the voltage difference of MRs 108-108n and 110-110n arranged in a grid on the top surface of die 106 as previously mentioned can be measured. Note that the grids of MR108-108n and MR110-110n may or may not overlap in embodiments. As depicted in FIG. 4, the respective grids do not overlap. The two MRs having the lowest sensitivity with respect to (I1+I2) can be selected. FIG. 4 shows five curves 1-5 corresponding to five different scenarios 1-5, where each curve represents the magnetic field parallel to the die surface versus x-position. For scenario 1, FIG. 4 shows that the fired on MR 108n is equal to the field on MR 110n, so that the difference is zero. Thus, in end-of-line testing, sensor 100 could be trimmed by selecting MR108n and MR110n. For scenario 5 in FIG. 4, the field on MR 108 is the same as the one on MR 110. Therefore, these two MRs can be selected during the trimming process. This makes it possible in embodiments to trim sensor 100 such that it does not respond to (I1+I2) but rather only (I1−I2). Any mismatch of the MRs is also trimmed by this procedure.

Referring again to FIG. 3, the concept can be generalized. Conductors 102 and 104 are of similar shape and carry the same current such that midway between the two, the respective magnetic fields of conductors 102 and 104 cancel to a large extent, in the sense that the magnitude of the total field is much less, e.g. by a factor of 100 or 1,000, than the magnitude of the fields caused by a single conductor. Conductors 102 and 104 are formed to have a small asymmetry such that the lateral magnetic field caused by identical currents in both conductors 102 and 104 exhibits a small peak at a certain position x for all assembly tolerances between conductors 102 and 104 and die 106. For all tolerances, there is at least one MR (108 or 110) to the left and one MR (110 or 108) to the right of the peak, with the lateral magnetic field identical on both MRs 108 and 110.

The asymmetry depicted in FIG. 3 is obtained by shifting conductor 104 slightly laterally with respect to conductor 102. In another embodiment, conductor 104 could be made slightly wider than conductor 102 such that the right edges of each are positioned as in FIG. 4 with the left edges flush. In yet another embodiment, the cross-sectional area of one of the conductors 102 or 104 can be tapered such that it is thicker (in the vertical direction with respect to the orientation of the drawing on the page) at the left side than the right, or vice-versa. Or, both conductors 102 and 104 can be tapered yet positioned such that the thicker end of one is flush with the thinner end of the other.

Figure 5:
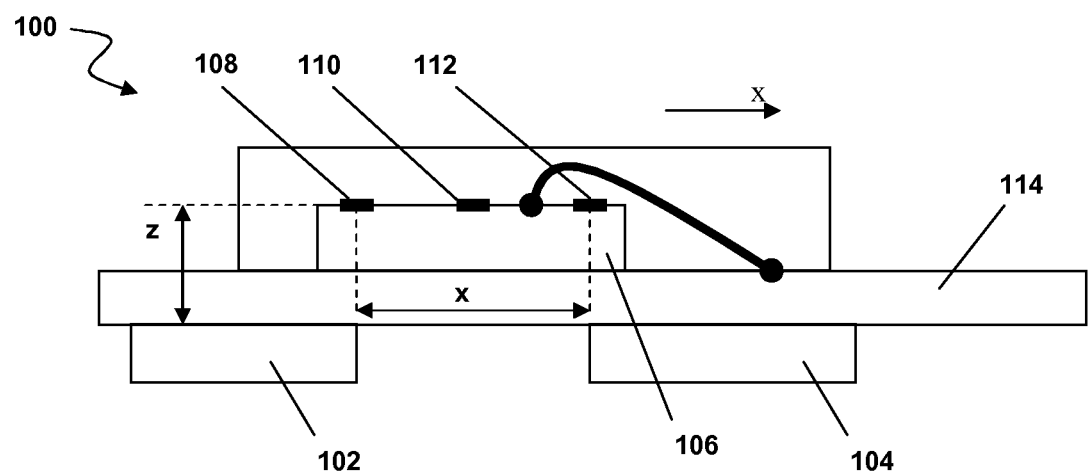
FIG. 5 depicts a side cross-sectional view of a current difference sensor according to an embodiment.

Other embodiments are also possible. In the embodiment of FIG. 5, sensor 100 comprises first and second conductors 102 and 104 mounted to a bottom side of a printed circuit board (PCB) 114 to isolate the conductors 102 and 104 from die 106, which is mounted to a top side of PCB 114. In embodiments, PCB 114 can be replaced by some other non-conducting structure comprising, for example, glass, porcelain or some other suitable material. Three MRs 108, 110 and 112 are mounted to a top side of die 106. In an embodiment, MRs 108 and 110 are separated by 1.25 mm, and MRs 110 and 112 are separated by 1.25 mm, such that MRs 108 and 112 are separated by 2.5 mm, though these dimensions can vary in embodiments. With currents in conductors 102 and 104 flowing into the drawing plane as depicted in FIG. 5, MR 108 detects a strong field from the current through conductor 102 and weak field from the current through conductor 104, whereas MR 112 responds more strongly to current through conductor 104 than through conductor 102. MR 110 responds equally to the currents in conductors 102 and 104 such that the field on MR 110 is proportional to the sum of the currents in conductors 102 and 104, whereas the fields on the other MRs 108 and 112 are neither proportional to pure sums nor pure differences of the currents but rather a combination of both.

A challenge with the embodiment of FIG. 5 is balancing sensitivity and saturation. High sensitivity is desired to measure small magnetic fields, but efforts to increase sensitivity, such as reducing the vertical distance between conductors 102 and 104 and MRs 108, 110 and 112 and/or the cross-sectional dimensions of conductors 102 and 104, can send the MRs into saturation such that larger current differences can no longer be detected. Such an embodiment can be suitable for various desired applications, however.

Figure 6:
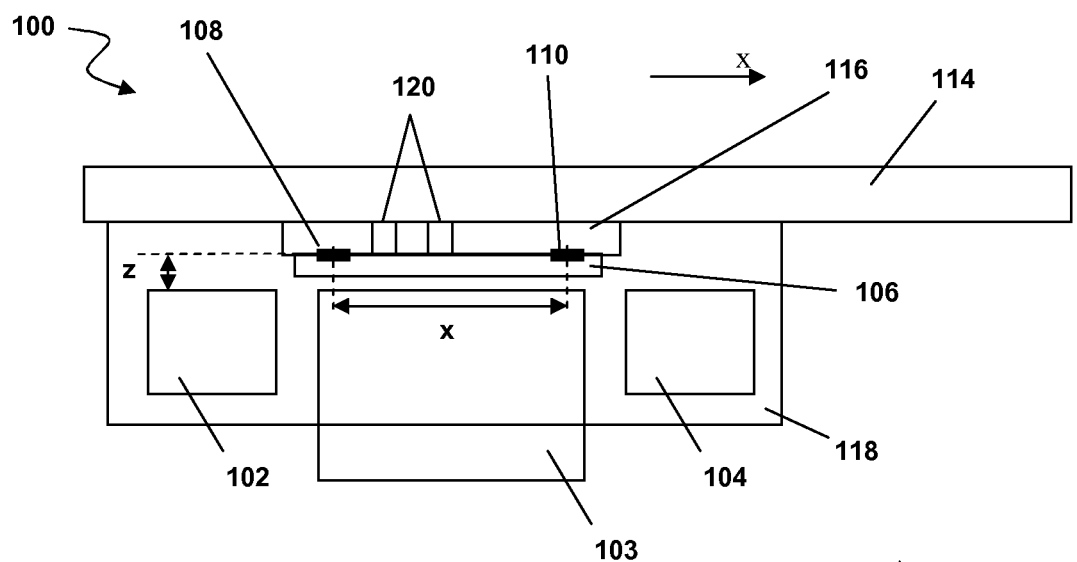
FIG. 6 depicts a side cross-sectional view of a current difference sensor according to an embodiment.

Another embodiment is depicted in FIG. 6, in which sensor 100 comprises three conductors 102, 103 and 104. Center conductor 103 can be used to "tune" sensor 100 such that positions are obtained without a magnetic field, and MRs 108 and 110 can then be arranged accordingly to see no net field. In an embodiment, conductors 102 and 104 are each about 1.2 mm by about 1.2 mm, and conductor 103 is about 1.7 mm by about 1.7 mm. Die 106 is coupled to a wafer 116, which is about 200 .mu.m thick and comprises glass or porcelain or some other suitable material in embodiments and includes through-vias 120. Vias 120 are filled with a conductor, such as a nano-paste, in embodiments. In one embodiment, the silicon of die 106 is ground down to about 30 .mu.m and adhesively bonded at its top side to wafer 116. Die(s) 106 can then be cut or otherwise formed into rectangles, and the bottom side(s) and sidewalls coated with a low-temperature dioxide or silicon oxide (SiOx). In an embodiment, the dioxide is about 15 .mu.m thick. MRs 108 and 110 are spaced apart about x=2 mm and are separated from the top side of conductors 102-104 by about z=50 .mu.m in an embodiment. Conductors 102-104, die 106 and wafer 116 are covered by a mold compound 118.

In an embodiment, current flows into the drawing plane (as depicted in FIG. 6) through center conductor 103 and out of the drawing plane (again, as depicted in FIG. 6) through outer conductors 102 and 104, each of which carries about half of the current. MR sensors 108 and 110 form a bridge and are arranged at locations where the magnetic fields of conductor 103 and either of conductors 102 and 104 cancel at equal currents.

Figure 7:
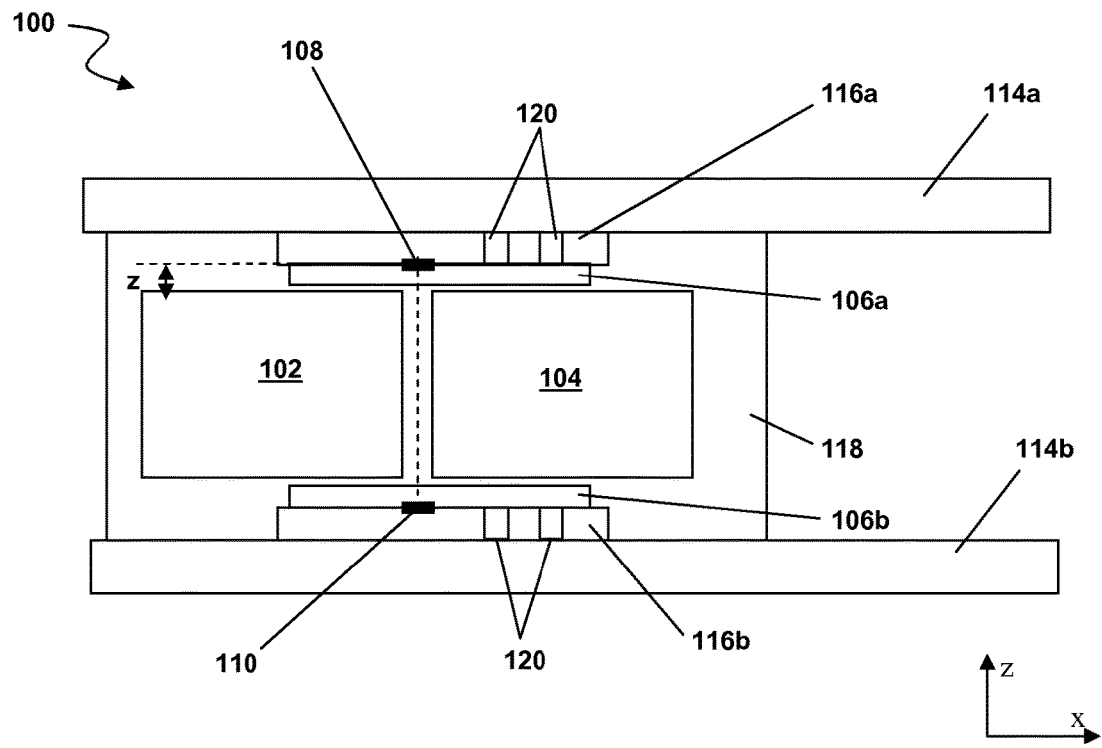
FIG. 7 depicts a side cross-sectional view of a current difference sensor according to an embodiment.

A further adaptation of sensor 100 of FIG. 6 is depicted in FIG. 7, in which sensor 100 comprises a dual-die package. One MR 108 is coupled to an upper die 106a, and another MR 110 is coupled to a lower die 106b, with MRs 108 and 110 located on a common axis in an embodiment. Conductors 102 and 104 are similar to conductor 103 in an embodiment and are about 1.7 mm by about 1.7 mm. Such an embodiment can provide advantages with respect to obtaining information about (I1+I2) and improve cancellation of background of fields. In an embodiment of sensor 100 of FIG. 7, wafers 116 can be omitted.

It can be difficult, because of assembly tolerances and other factors, to arrange MRs 108 and 110 on the same axis, represented by a dashed vertical line in FIG. 7. Therefore, another, potentially more robust embodiment of sensor 100 depicted in FIG. 8 can address this challenge by including additional MRs 109 and 111. In an embodiment, conductors 102 and 104 are each about 0.9 mm by about 1.7 mm, and conductor 103 is about 1.7 mm by about 1.7 mm. Conductors 102-104 are cast into glass 122 in an embodiment, and contacts 124 couple PCBs 114a and 114b. MRs 108-111 are separated from conductors 102-104 by z=about 250 .mu.m in embodiments.

In operation, current I1 flows through conductor 103, while current I2 is split into two halves which each flow through one of conductors 102 and 104 in the opposite direction of current I1. The signals of MRs 108 and 109 are added, as are those of MRs 110 and 111, with the latter then subtracted from the former. Because MRs 108 and 110 experience strong I1 fields, while MRs 109 and 111 experience strong I2 fields of the opposite polarity of I1, lateral positioning shifts of the MRs 108-111 are compensated for. Casting conductors 102-104 in glass helps to avoid dimensional changes over the lifetime thereof due to moisture and other factors.

Figure 8:
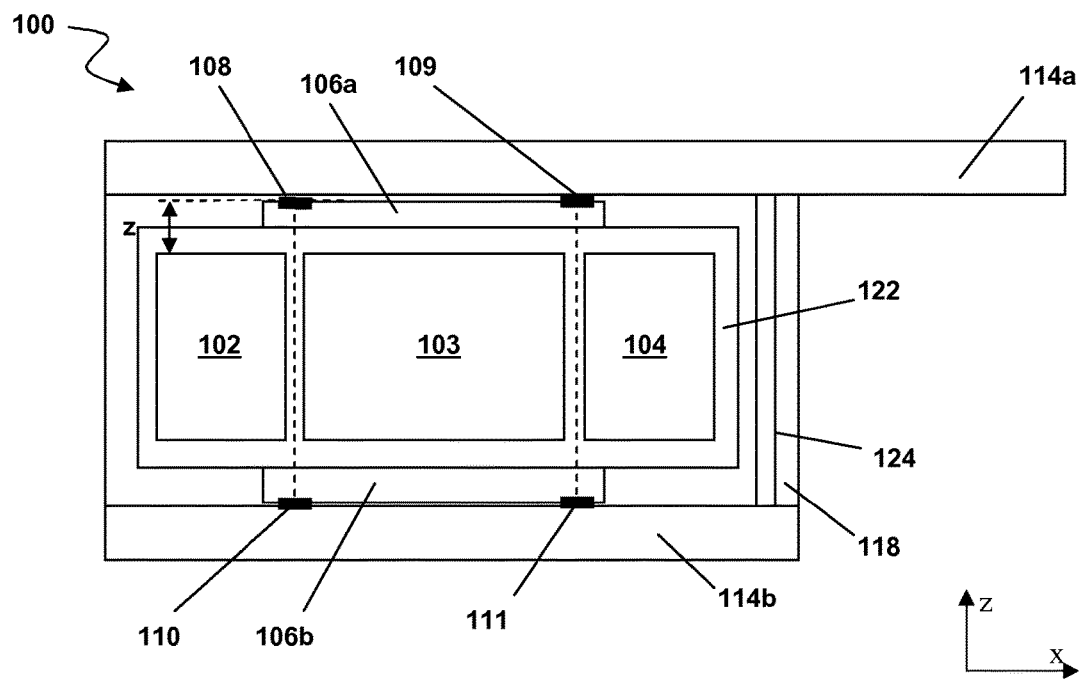
FIG. 8 depicts a side cross-sectional view of a current difference sensor according to an embodiment.
Figure 9:
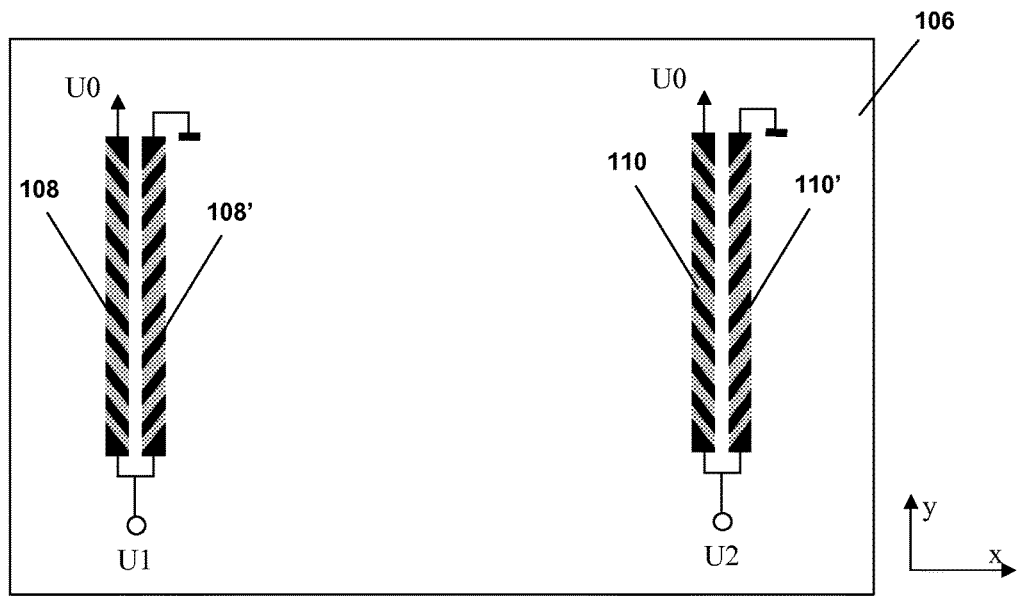
FIG. 9 depicts orthogonal magnetic field sensor elements according to an embodiment.

A potential drawback of the embodiment of FIG. 8, however, is the expense of a dual-die solution. In various embodiments, temperature can also be an issue. To provide temperature compensation, orthogonal MRs can be added, an embodiment of which is depicted in FIG. 9. FIG. 9 depicts two MRs 108 and 110, each with an orthogonal MR 108' and 110' forming half-bridges. Embodiments comprising additional MRs, such as grids of MRs as discussed herein, can similarly comprise additional orthogonal MRs. In operation, and with the barber poles as depicted in FIG. 9, MRs 108 and 110 are sensitive to weak fields in the x-direction, while MRs 108' and 110' are sensitive to weak fields in the −x-direction. The close arrangements of MRs 108 and 108', and 110 and 110', ensures that each sees the same magnetic field and temperature. The signals of each half-bridge, U1 and U2, are therefore temperature compensated.

Figure 10A:
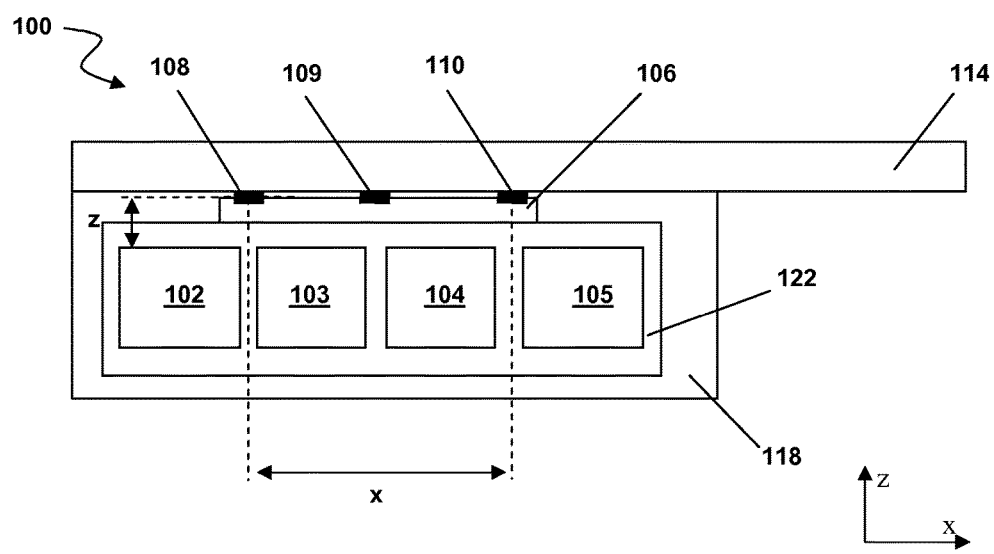
FIG. 10A depicts a side cross-sectional view of a current difference sensor according to an embodiment.
Figure 10B:
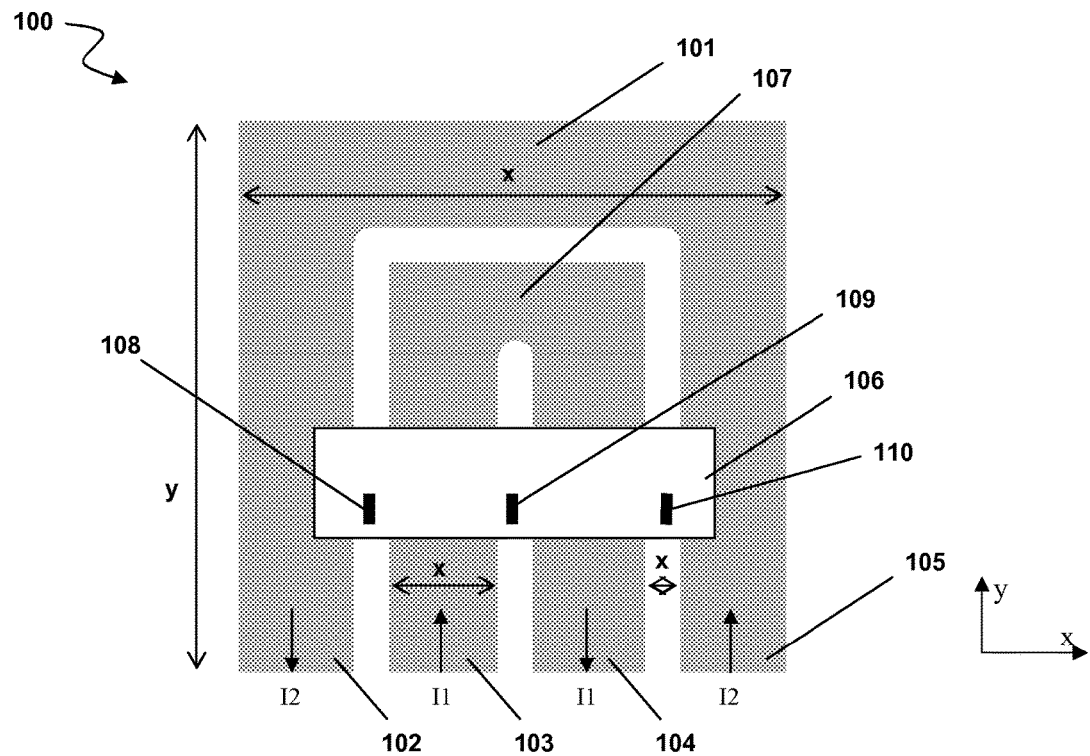
FIG. 10B depicts a top plan view of the current difference sensor of FIG. 10A.
Figure 10:
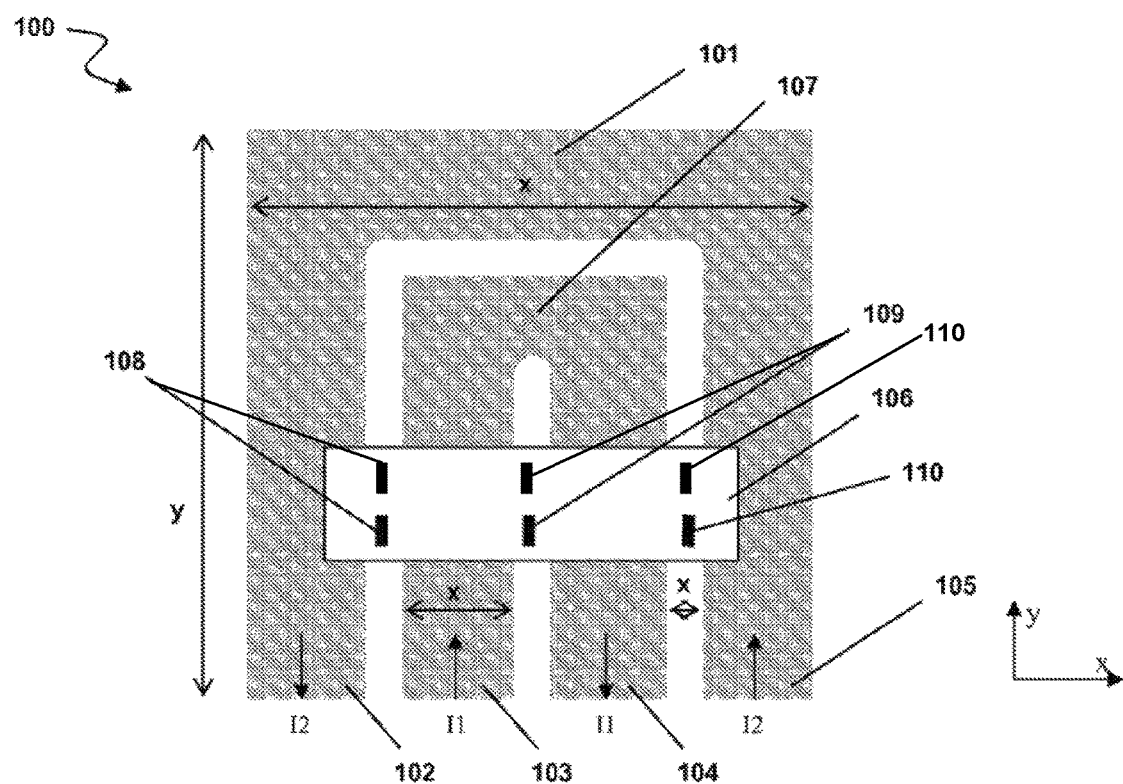
FIG. 10C depicts a top plan view of a current difference sensor according to an embodiment.

Another embodiment of a sensor 100 is depicted in FIG. 10. In this embodiment, sensor 100 comprises a single die 106, with three MRs 108, 109 and 100 mounted on a top surface thereof. Although the dimensions can vary in embodiments, in one embodiment die 106 can be about 4 mm by about 1.75 mm, with a thickness of about 200 .mu.mu.m, and MRs 108 and 110 are spaced apart by x=about 4 mm. Four conductors 102, 103, 104 and 105 are cast into glass 122, similar to the embodiment of FIG. 8, with a top surface of conductors 102-105 spaced apart from MRs 108-110 by z=about 250 .mu.m in an embodiment. As depicted in FIG. 10B, conductors 102-105 comprise conductor portions, with conductors 102 and 105, along with a connecting portion 101, forming a first generally U-shaped conductor element, and conductors 103 and 104, along with a connecting portion 107, forming a second generally U-shaped conductor element. A cross-section of each of conductors 102-105 as depicted in FIG. 10A is about 1.7 mm by about 1.7 mm in an embodiment. In FIG. 10B, the length of conductors 102 and 105 is y=about 10 mm, with a width of x=about 8.3 mm of connecting portion 101. A separation distance between adjacent ones of the conductors 102-15 is x=about 0.5 mm in the embodiment depicted.

Another embodiment of a sensor 100 is depicted in FIG. 10C. The embodiment depicted in FIG. 10C is similar to the embodiment depicted in FIG. 10B but includes additional MRs 108, 109, and 110 arranged in a grid pattern. The embodiment of sensor 100 depicted in FIG. 10C includes conductors 102-105 which comprise conductor portions, with conductors 102 and 105, along with a connecting portion 101, forming a first generally U-shaped conductor element, and conductors 103 and 104, along with a connecting portion 107, forming a second generally U-shaped conductor element.

Advantages of the embodiment of FIG. 10 include a single die, which is less expensive and provides easier assembly, because it does not require pins for communication with a second die. A single die also provides fewer opportunities for mismatch of the MR sensor elements as well as improved temperature homogeneity. The MRs of FIG. 10 can comprise orthogonal MRs, such as are depicted in FIG. 9 and discussed above, in embodiments.

Figure 11:
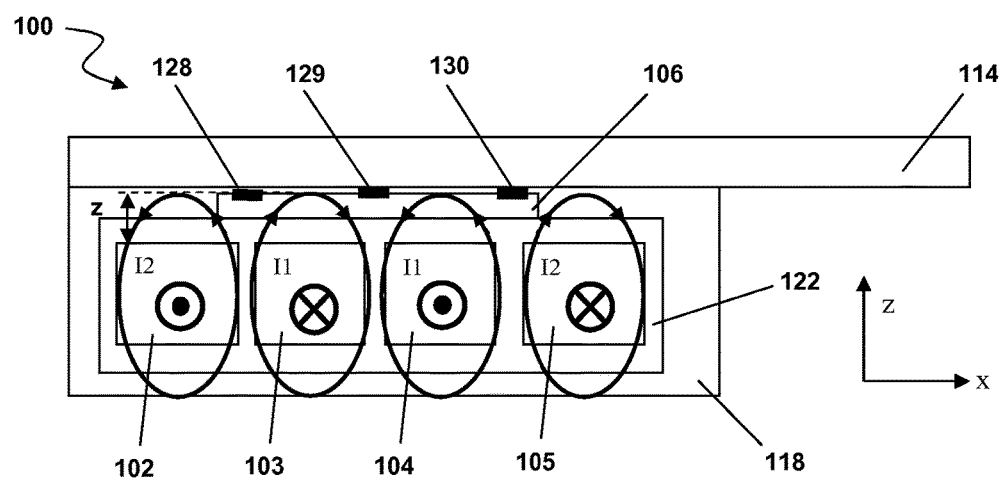
FIG. 11 depicts a side cross-sectional view of a current difference sensor according to an embodiment.

Sensor system 100 depicted in FIG. 11 is similar to that of FIG. 10 but comprises a triple Hall element 128, 129 and 130 system in addition to MRs to measure the sum of the currents I1+I2. Advantages of the embodiment of FIG. 11 include increased robustness against disturbances and improved tamper-resistance.

On the other hand, Hall elements 128-130 should be positioned closer to conductors 102-105. Therefore, another embodiment (not depicted) comprises Hall elements 128-130 on a bottom side of die 106 and MRs on a top side of die 106. Die 106 can be about 200 .mu.m thick in such an embodiment.

Figure 12:
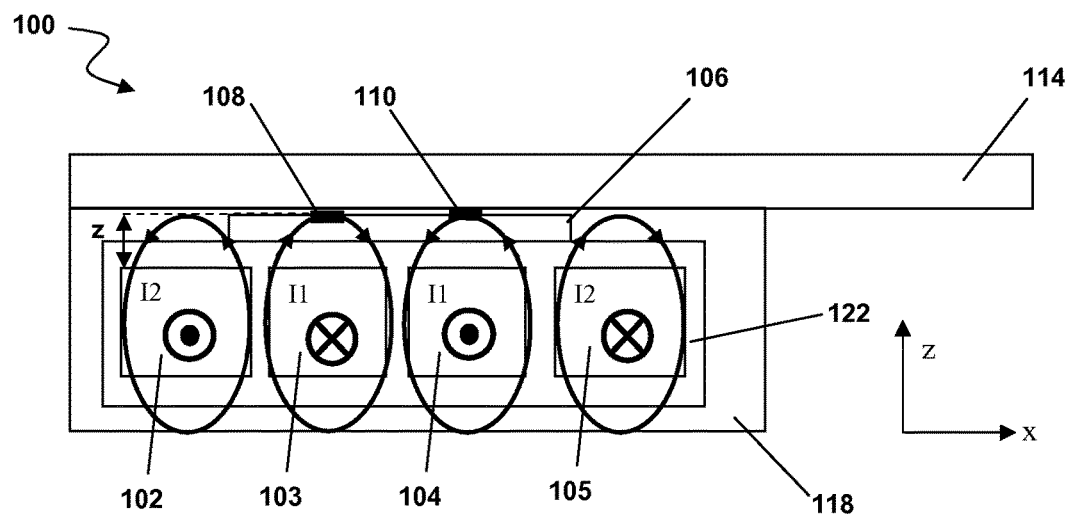
FIG. 12 depicts a side cross-sectional view of a current difference sensor according to an embodiment.

Alternatively, AMRs 108 and 110 can be implemented to measure I1+x*I2 (x<<1), as depicted in the embodiment of FIG. 12. AMRs 108 and 100 can be positioned on a top surface of die 106, which can be about 200 .mu.m thick in an embodiment, such that a separation distance between AMRs 108 and 110 and top surfaces of conductors 102-15 is z=about 250 .mu.m. Such a system is generally robust against background fields, though not as robust as the triple Hall embodiment of FIG. 11. The small damping effect, x, is due to the distance between conductors 102 and 105, through which current I2 flows, and AMRs 108 and 110.

Figure 13:
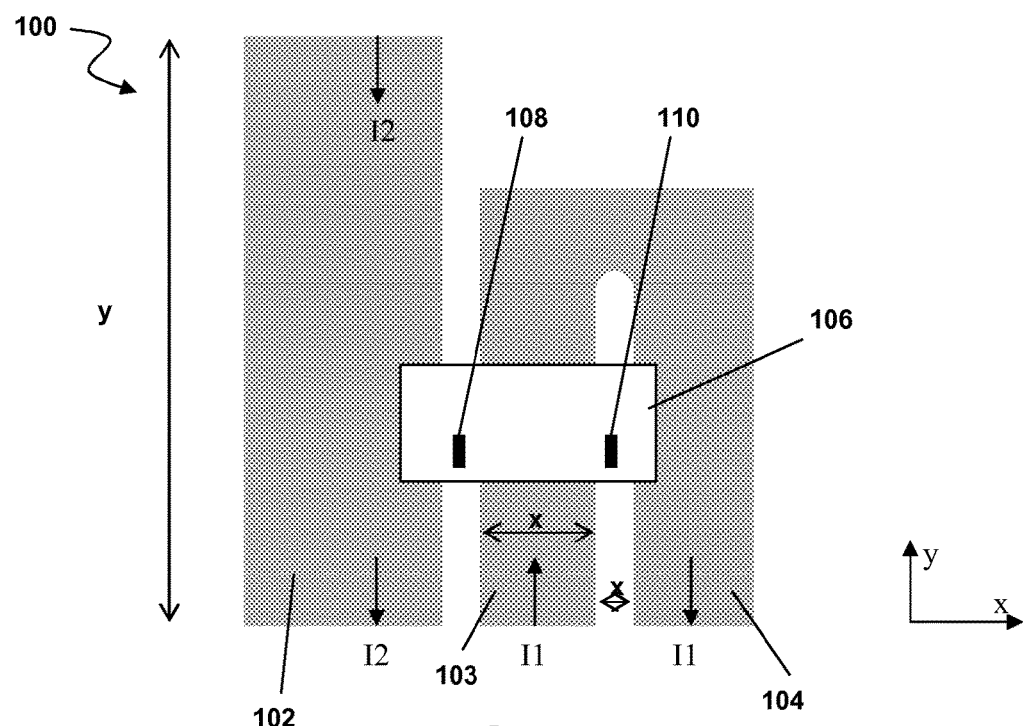
FIG. 13 depicts a top plan view of a current difference sensor according to an embodiment.

In the embodiment of FIG. 13, a return path for I2 is omitted, such that only three conductors 102-104 are implemented. The conductors 102-104, however, can be made wider, such as x=about 3.5 mm for each of conductors 103 and 104 and x=about 6 mm for conductor 102, and dissipation reduced by about 50%. A separation distance between conductors 103 and 104 is still x=about 0.5 mm in an embodiment, and a length of conductor 102 is y=about 10 mm in an embodiment.

Yet another embodiment is depicted in FIG. 14, in which sensor system 100 comprises a multi-level conductor 132, at least somewhat similar to the embodiments discussed above with respect to FIGS. 1-4. Conductor 132 (FIG. 14C) comprises a first layer 134 (FIG. 14A) and a second layer 136 (FIG. 14B) in an embodiment. In an embodiment, isolation layers 138 are positioned between die 106 and conductor level 136, and between conductor level 136 and conductor level 134.

Various embodiments of current and current difference sensing and determination systems are disclosed. Embodiments can be advantageous by providing single sensor systems capable of measuring current flow (I1+I2) and leakage currents (I1−I2) while also being small in size, robust against interference and inexpensive when compared with conventional difference current sensor systems. Embodiments can also be combined with an isolated voltage sensor in order to obtain a full power measurement.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A current difference sensor comprising:
   a first conductor configured to conduct a first current that generates a first magnetic field component in a first direction;
   a second, different conductor configured to conduct a second current that generates a second magnetic field component in the first direction;
   a first magnetic field sensing element, arranged at a first position, configured to sense the first magnetic field component and the second magnetic field component in the first direction;
   a second magnetic field sensing element, arranged at a second position, configured to sense the first magnetic field component and the second magnetic field component in the first direction;
   wherein the first conductor and the second, different conductor, located proximate to one another, are configured to approximately cancel the first magnetic field component in the first direction and the second magnetic field component in the first direction in response to the first current flowing through the first conductor and the second current flowing through the second conductor.

2. The current difference sensor of claim 1, wherein the first conductor and the second, different conductor are configured to approximately cancel the first magnetic field component in the first direction and the second magnetic field component in the first direction, at a first location and at a second location, in response to the first current flowing through the first conductor and the second current flowing through the second, different conductor.

3. The current different sensor of claim 1, wherein a sum of the first magnetic field and the second magnetic field at a first location is approximately equal to a sum of the first magnetic field and the second magnetic field at a second location.

4. The current difference sensor of claim 1, wherein the first current is approximately equal to the second current.

5. The current difference sensor of claim 1, further comprising circuitry, coupled to the first magnetic field sensing element and the second magnetic field sensing element, configured to determine a difference between magnetic fields being sensed at a first location and a second location.

6. The current difference sensor of claim 1, further comprising circuitry, coupled to the first magnetic field sensing element and the second magnetic field sensing element, configured to determine a difference between the first current and the second current based on magnetic fields at a first location and at a second location.

7. The current difference sensor of claim 1, further comprising a plurality of magnetic field sensing elements, the first magnetic field sensing element and the second magnetic field sensing element being two of the plurality of magnetic field sensing elements, wherein the first magnetic field sensing element and second magnetic field sensing element from the plurality of magnetic field sensing element comprise a lower sensitivity to a sum of the first current and the second current and a higher sensitivity to a difference between the first current and the second current with respect to other magnetic field sensing elements of the plurality of magnetic field sensing elements.

8. The current difference sensor of claim 1, further comprising a plurality of magnetic field sensing elements, the first magnetic field sensing element and the second magnetic field sensing element being two of the plurality of magnetic field sensing elements, the plurality of magnetic field sensing elements arranged in a grid pattern with respect to one another across a first surface of a die.

9. The current difference sensor of claim 8, wherein the die is arranged at a tilt angle with respect to a center of symmetry between the first conductor and the second conductor.

10. The current difference sensor of claim 8, wherein the die comprises a second surface that is opposite to the first surface, and wherein the second surface is positioned closer to the first conductor and the second conductor than the first surface.

11. The current difference sensor of claim 1, wherein the first conductor and the second, different conductor are asymmetrical in shape with respect to one another.

12. The current difference sensor of claim 1, where the first magnetic field sensing element is an anisotropic magnetic field sensing element or a giant magnetic field sensing element, and where the second magnetic field sensing element is an anisotropic magnetic field sensing element or a giant magnetic field sensing element.

* * * * *